(12) United States Patent
Hsieh

(10) Patent No.: US 6,580,119 B1
(45) Date of Patent: Jun. 17, 2003

(54) STACKED GATE FIELD EFFECT TRANSISTOR (FET) DEVICE

(75) Inventor: Chia-Ta Hsieh, Tainan (TW)

(73) Assignee: Taiwan Semiconductor Manufacturing, Co., Ltd., Hsin Chu (TW)

(*) Notice: Subject to any disclaimer, the term of this patent is extended or adjusted under 35 U.S.C. 154(b) by 0 days.

(21) Appl. No.: 10/102,285

(22) Filed: Mar. 20, 2002

(51) Int. Cl.⁷ .............................................. H01L 29/788
(52) U.S. Cl. ................. 257/315; 257/314; 257/316; 257/320; 257/321; 257/322; 438/266; 438/257; 438/264; 438/594
(58) Field of Search .................................. 251/314, 315, 251/316, 320, 321, 322; 438/266, 257, 264, 594

(56) References Cited

U.S. PATENT DOCUMENTS 4,852,062 A   7/1989   Baker et al.
6,261,905 B1  7/2001   Chen et al.
6,262,452 B1 * 7/2001  Ono et al. .................. 257/316

* cited by examiner

Primary Examiner—Tom Thomas
Assistant Examiner—Thomas Magee
(74) Attorney, Agent, or Firm—Tung & Associates

(57) ABSTRACT

Within a stacked gate field effect transistor (FET) device, as well as a method for fabrication thereof and a method for operation thereof, there is provided a stacked gate field effect transistor (FET) device comprising a layered stack of a tunneling dielectric layer, a floating gate electrode, an inter-gate electrode dielectric layer and a control gate electrode formed upon a semiconductor substrate. To enhance performance of the stacked gate field effect transistor (FET) device, at least one of: (1) the floating gate electrode is formed with a pointed edge tip at its outer sidewall; (2) the floating gate electrode in formed with a pointed linear recess centered within its linewidth; and (3) a pair of source/drain regions is formed asymmetrically penetrating beneath the pair of opposite edges of the floating gate electrode and not laterally spaced from a floating gate electrode sidewall.

5 Claims, 4 Drawing Sheets

STACKED GATE FIELD EFFECT TRANSISTOR (FET) DEVICE

BACKGROUND OF THE INVENTION

1. Field of the Invention

The present invention relates to stacked gate field effect transistor (FET) devices. More particularly, the present invention relates to stacked gate field effect transistor (FET) devices with enhanced performance.

2. Description of the Related Art

Semiconductor integrated circuit microelectronic fabrications are formed from semiconductor substrates within and upon which are formed semiconductor devices and over which are formed patterned microelectronic conductor layers which are separated by microelectronic dielectric layers.

Common in the art of semiconductor integrated circuit microelectronic fabrication are conventional field effect transistor (FET) devices which are employed as switching elements within both logic semiconductor integrated circuit microelectronic fabrications and memory semiconductor integrated circuit microelectronic fabrications. Also known in the art of semiconductor integrated circuit microelectronic fabrication are stacked gate field effect transistor (FET) devices which in contrast to conventional field effect transistor (FET) devices employ gate electrode stacks comprising floating gate electrodes having formed thereupon inter-gate electrode dielectric layers in turn having formed thereupon control gate electrodes. As is understood by a person skilled in the art, stacked gate field effect transistor (FET) devices differ from conventional field effect transistor (FET) devices insofar as stacked gate field effect transistor (FET) devices provide for non-volatile digital data storage within the floating gate electrodes within stacked gate field effect transistor (FET) devices.

While stacked gate field effect transistor (FET) devices are thus clearly desirable in the art of semiconductor integrated circuit microelectronic fabrication, stacked gate field effect transistor (FET) devices are nonetheless not entirely without problems in the art of semiconductor integrated circuit microelectronic fabrication.

In that regard, stacked gate field effect transistor (FET) devices are often difficult to fabricate within semiconductor integrated circuit microelectronic fabrications with enhanced performance.

It is thus desirable in the art of semiconductor integrated circuit microelectronic fabrication to fabricate stacked gate field effect transistor (FET) devices with enhanced performance.

It is towards the foregoing object that the present invention is directed.

Various stacked gate field effect transistor (FET) devices, and methods for fabrication thereof, have been disclosed in the art of semiconductor integrated circuit microelectronic fabrication.

Included among the stacked gate field effect transistor (FET) devices and methods for fabrication thereof, but not limited among the stacked gate field effect transistor (FET) devices and methods for fabrication thereof, are stacked gate field effect transistor (FET) devices and methods for fabrication thereof disclosed within: (1) Baker et al., in U.S. Pat. No. 4,852,062 (a stacked gate field effect transistor (FET) device and method for fabrication thereof having enhanced performance incident to fabricating the stacked gate field effect transistor (FET) device with asymmetrically spaced source/drain regions); and (2) Chen et al., in U.S. Pat. No. 6,291,905 (a stacked gate field effect transistor (FET) device and method for fabrication thereof with enhanced manufacturability incident to fabricating the stacked gate field effect transistor (FET) device employing a damascene method)

Desirable in the art of semiconductor integrated circuit microelectronic fabrication are additional methods and materials which may be employed for fabricating stacked gate field effect transistor (FET) devices with enhanced performance.

It is towards the foregoing object that the present invention is directed.

SUMMARY OF THE INVENTION

A first object of the present invention is to provide a stacked gate field effect transistor (FET) device and a method for fabricating the stacked gate field effect transistor (FET) device.

A second object of the present invention is to provide a stacked gate field effect transistor (FET) device and a method for fabrication thereof in accord with the first object of the present invention, wherein the stacked gate field effect transistor (FET) device is fabricated with enhanced performance.

A third object of the present invention is to provide a stacked gate field effect transistor (FET) device and a method for fabrication thereof in accord with the first object of the present invention and the second object of the present invention, wherein the method is readily commercially implemented.

In accord with the objects of the present invention, there is provided by the present invention a stacked gate field effect transistor (FET) device and a method for fabricating the stacked gate field effect transistor (FET) device. Similarly, the present invention also provides a related method for operating the stacked gate field effect transistor (FET) device.

To practice the method of the present invention, there is first provided a semiconductor substrate having an active region defined therein. There is then formed upon the active region of the semiconductor substrate a tunneling dielectric layer. There is then formed upon the tunneling dielectric layer a floating gate electrode. There is then formed upon the floating gate electrode an inter-gate electrode dielectric layer. There is then formed upon the inter-gate electrode dielectric layer a control gate electrode which is typically and preferably aligned at least in part with the floating gate electrode. Finally, there is also formed adjacent a pair of opposite edges of the floating gate electrode a pair of source/drain regions. Within the present invention, at least one of: (1) the floating gate electrode is formed with a pointed edge tip at its outer sidewall; (2) the floating gate electrode in formed with a pointed linear recess centered within its linewidth; and (3) the pair of source/drain regions is formed asymmetrically penetrating beneath the pair of opposite edges of the floating gate electrode and not laterally spaced from a floating gate electrode sidewall.

The present invention provides a stacked gate field effect transistor (FET) device and a method for fabricating the stacked gate field effect transistor (FET) device, wherein the stacked gate field effect transistor (FET) device is fabricated with enhanced performance.

The present invention realizes the foregoing object by fabricating a stacked gate field effect transistor (FET) device wherein at least one of: (1) a floating gate electrode is formed with a pointed edge tip at its outer sidewall; (2) the floating gate electrode in formed with a pointed linear recess centered within its linewidth; and (3) a pair of source/drain regions is formed asymmetrically penetrating beneath the pair of opposite edges of the floating gate electrode and not laterally spaced from a floating gate electrode sidewall.

The method of the present invention is readily commercially implemented.

The present invention employs methods and materials as are otherwise generally conventional in the art of semiconductor integrated circuit microelectronic fabrication, but employed within the context of a specific process ordering to provide a stacked gate field effect transistor (FET) device in accord with the present invention. Since it is thus at least in part a specific process ordering which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a stacked gate field effect transistor (FET) device and a method for fabricating the stacked gate field effect transistor (FET) device, wherein the stacked gate field effect transistor (FET) device is fabricated with enhanced performance.

The present invention realizes the foregoing object by fabricating a stacked gate field effect transistor (FET) device wherein at least one of: (1) a floating gate electrode is formed with a pointed edge tip at its outer sidewall; (2) the floating gate electrode in formed with a pointed linear recess centered within its linewidth; and (3) a pair of source/drain regions is formed asymmetrically penetrating beneath the pair of opposite edges of the floating gate electrode and not laterally spaced from a floating gate electrode sidewall.

Referring now to FIG. 1 to FIG. 8B, there is shown a series of schematic plan-view and schematic cross-sectional diagrams illustrating the results of progressive stages of fabricating, in accord with a preferred embodiment of the present invention, a stacked gate field effect transistor (FET) device within a semiconductor integrated circuit microelectronic fabrication.

Figure 1:
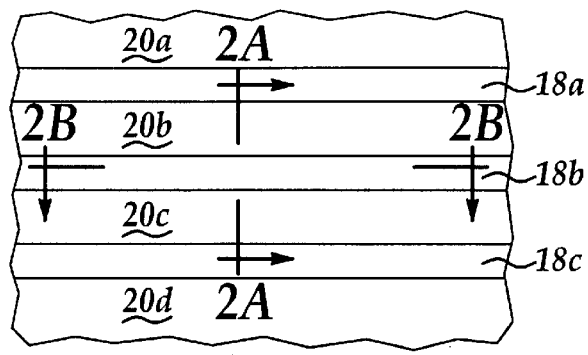
FIG. 1, FIG. 2A, FIG. 2B, FIG. 3A, FIG. 3B, FIG. 4A, FIG. 4B, FIG. 5A, FIG. 5B, FIG. 6A, FIG. 6B, FIG. 7A, FIG. 7B, FIG. 8A and FIG. 8B show a series of schematic plan-view and cross-sectional diagrams illustrating the results of progressive stages of forming, in accord with a preferred embodiment of the present invention, a stacked gate field effect transistor (FET) device within a semiconductor integrated circuit microelectronic fabrication.

Shown in FIG. 1 is a schematic plan-view diagram of the semiconductor integrated circuit microelectronic fabrication at an early stage of fabricating therein the stacked gate field effect transistor (FET) device in accord with the preferred embodiment of the present invention.

Shown in FIG. 1 is a series of patterned second silicon nitride layers 18a, 18b and 18c which separate a series of patterned silicon oxide trench fill layers 20a, 20b, 20c and 20d. Within the present invention, the nature of both of the foregoing series of patterned layers will be disclosed in greater detail below. Importantly, FIG. 1 also illustrates a pair of perpendicular cross-sectional reference lines 2A—2A and 2B—2B, each one of which serves as a reference plane for defining the schematic cross-sectional diagrams of FIG. 2A and FIG. 2B with respect to the schematic plan-view diagram of FIG. 1, as well as for defining the remainder of the series of schematic cross-sectional diagrams within FIG. 3A, FIG. 3B, FIG. 4A, FIG. 4B, FIG. 5A, FIG. 5B, FIG. 6A, FIG. 6B, FIG. 7A, FIG. 7B, FIG. 8A and FIG. 8B with respect to the schematic plan-view diagram of FIG. 1 and with respect to each other.

Figure 2A:
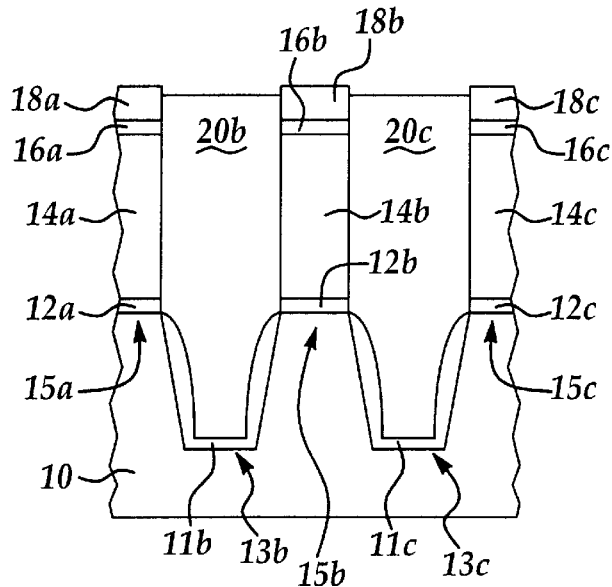
Figure 2B:
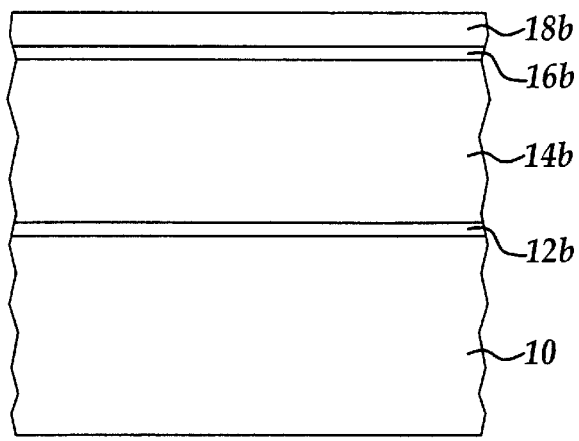

Referring now to FIG. 2A and FIG. 2B, there is shown a pair of schematic cross-sectional diagrams corresponding with the schematic plan-view diagram of FIG. 1.

Shown primarily in FIG. 2A (and to a generally lesser extend in FIG. 2B) is a semiconductor substrate 10 having formed therein a pair of isolation trenches 13b and 13c which define a series of active regions 15a, 15b and 15c of the semiconductor substrate 10. Shown also in particular within the schematic cross-sectional diagram of FIG. 2A is: (1) a pair of patterned isolation trench dielectric liner layers 11b and 11c formed within the pair of isolation trenches 13b and 13c; and (2) the pair of patterned silicon oxide trench fill layers 20b and 20c formed upon the pair of patterned isolation trench dielectric liner layers 11b and 11c.

Finally, there is also shown in particular within the schematic cross-sectional diagram of FIG. 2A, and formed upon the series of active regions 15a, 15b and 15c of the semiconductor substrate 10: (1) a series of patterned pad oxide layers 12a, 12b and 12c, having formed aligned thereupon; (2) a series of patterned first silicon nitride layers 14a, 14b and 14c, having formed aligned thereupon; (3) a series of patterned intermediate silicon oxide layers 16a, 16b and 16c, finally in turn having formed aligned thereupon; (4) the series of patterned second silicon nitride layers 18a, 18b and 18c.

Within the preferred embodiment of the present invention, the semiconductor substrate 10 and each of the foregoing series of patterned layers formed thereupon or thereover may be formed employing methods and materials as are otherwise generally conventional in the art of semiconductor integrated circuit microelectronic fabrication.

For example, and without limitation: (1) the semiconductor substrate 10 is typically and preferably a (100) silicon semiconductor substrate having formed therein the pair of isolation trenches 13b and 13b of linewidth from about 0.1 to about 0.2 microns and depth from about 2000 to about 4500 angstroms, in turn having formed therein; (2) the pair of patterned isolation trench dielectric liner layers 11b and 11c formed of a thermal silicon oxide dielectric material formed to a thickness of from about 100 to about 300 angstroms, in turn having formed thereupon; (3) the pair of patterned silicon oxide trench fill layers 20b and 20c formed of a silicon oxide material deposited employing a chemical vapor deposition (CVD) method formed to a thickness of from about 5000 to about 8000 angstroms.

Similarly, and also for example, and also without limitation, the series of active regions 15a, 15b and 15c of the semiconductor substrate 10 is typically and preferably formed of a linewidth from about 0.1 to about 0.2 microns while having formed aligned thereupon or aligned thereover: (1) the series of patterned pad oxide layers 12a, 12b and 12c each formed of a thermal silicon oxide dielectric material formed to a thickness of from about 80 to about 250 angstroms; (2) the series of patterned first silicon nitride layers 14a, 14b and 14c each formed to a thickness of from about 2000 to about 4000 angstroms while employing a chemical vapor deposition (CVD) method; (3) the series of patterned intermediate silicon oxide layers 16a, 16b and 16c each formed to a thickness of from about 60 to about 200 angstroms while employing a chemical vapor deposition (CVD) method; and (4) the series of patterned second silicon nitride layers 18a, 18b and 18c each formed to a thickness of from about 200 to about 500 angstroms while employing a chemical vapor deposition (CVD) method.

Figure 3A:
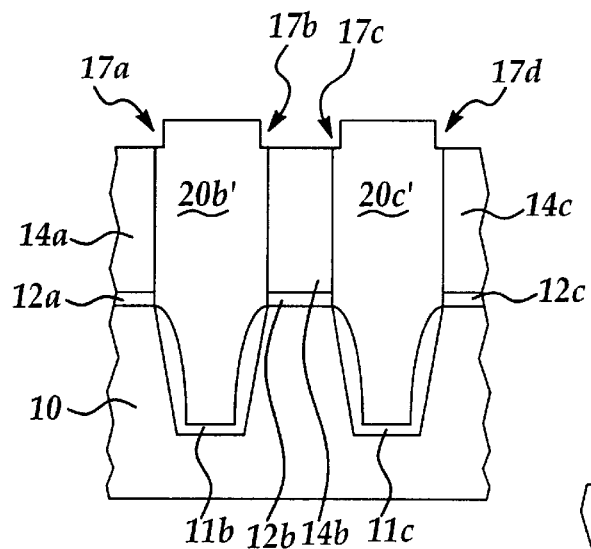
Figure 3B:
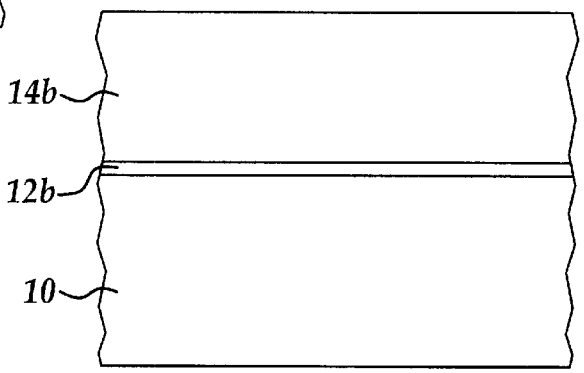

Referring now to FIG. 3A and FIG. 3B, there is shown a pair of schematic cross-sectional diagrams illustrating the results of further processing of the semiconductor integrated circuit microelectronic fabrication whose schematic cross-sectional diagram is illustrated in FIG. 2A and FIG. 2B.

Shown in FIG. 3A and FIG. 3B is a pair of schematic cross-sectional diagrams of a semiconductor integrated circuit microelectronic fabrication otherwise equivalent to semiconductor integrated circuit microelectronic fabrication whose schematic cross-sectional diagrams correspond with FIG. 2A and FIG. 2B, but wherein: (1) the series of patterned second silicon nitride layers 18a, 18b and 18c has been stripped from the series of patterned intermediate silicon oxide layers 16a, 16b and 16c; (2) the series of patterned intermediate silicon oxide layers 16a, 16b and 16c has been stripped from the series of patterned first silicon nitride layers 14a, 14b and 14c; and (3) the pair of patterned silicon oxide trench fill layers 20b and 20c has been etched to form a pair of etched patterned silicon oxide trench fill layers 20b' and 20c'.

Within the preferred embodiment of the present invention, the series of patterned silicon nitride layers 18a, 18b and 18c may be stripped from the series of patterned intermediate silicon oxide layers 16a, 15b and 16c while employing an aqueous phosphoric acid stripping solution at an elevated temperature. Similarly, the series of patterned intermediate silicon oxide layers 16a, 16b and 16c may be stripped from the series of patterned first silicon nitride layers 14a, 14b and 14c, while simultaneously forming from the pair of patterned silicon oxide trench fill layers 20b and 20c the pair of etched patterned silicon oxide trench fill layers 20b' and 20c', while employing an aqueous hydrofluoric acid containing etchant solution, such as a dilute hydrofluoric acid etchant solution or a buffered oxide etchant solution (i.e., an aqueous hydrofluoric acid and ammonium fluoride etchant solution).

As is illustrated in particular within the schematic cross-sectional diagram of FIG. 3A, incident to forming from the pair of patterned silicon oxide trench fill layers 20b and 20c the pair of etched patterned silicon oxide trench fill layers 20b' and 20c', a series of notches 17a, 17b, 17c and 17d is formed within a pair of upper sidewall edges of the pair of etched patterned silicon oxide trench fill layers 20b' and 20c'.

Figure 4A:
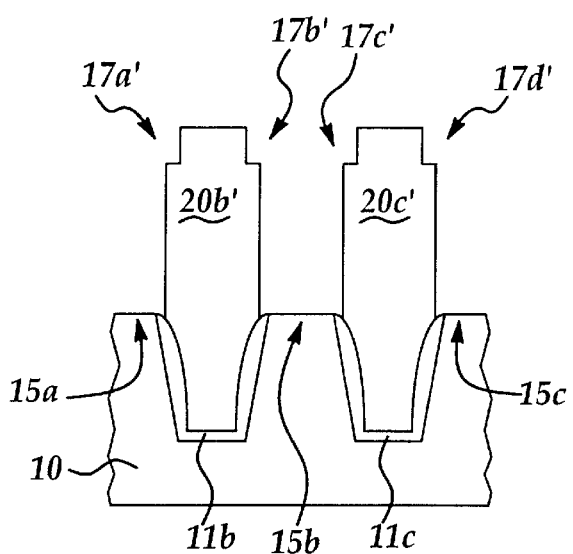
Figure 4B:
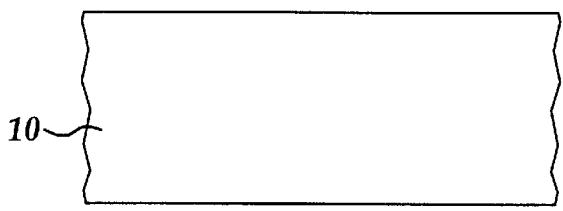

Referring now to FIG. 4A and FIG. 4B, there is shown a pair of schematic cross-sectional diagrams illustrating the results of further processing of the semiconductor integrated circuit microelectronic fabrication whose schematic cross-sectional diagram is illustrated in FIG. 3A and FIG. 3B.

Shown in FIG. 4A and FIG. 4B is a pair of schematic cross-sectional diagrams of a semiconductor integrated circuit microelectronic fabrication otherwise equivalent to the semiconductor integrated circuit microelectronic fabrication whose schematic cross-sectional diagrams is illustrated in FIG. 3A and FIG. 3B, but wherein: (1) the series of patterned first silicon nitride layers 14a, 14b and 14c has been stripped from the series of patterned pad oxide layers 12a, 12b and 12c; (2) the series of patterned pad oxide layers 12a, 12b and 12c has been stripped from the series of active regions 15a, 15b and 15c of the semiconductor substrate 10; and (3) the pair of etched patterned silicon oxide trench fill layers 20a' and 20b' has been further etched to form a pair of twice etched patterned silicon oxide trench fill layers 20b" and 20c" having defined therein a corresponding series of etched notches 17a', 17b', 17c' and 17d'.

Within the preferred embodiment of the present invention, the series of patterned first silicon nitride layers 14a, 14b and 14c may be stripped from the series of patterned pad oxide layers 12a, 12b and 12c while again employing an aqueous phosphoric acid stripping solution. Similarly, within the preferred embodiment of the present invention, the series of patterned pad oxide layers 12a, 12b and 12c may be stripped from the active regions 15a, 15b and 15c of the semiconductor substrate 10 and the pair of etched patterned silicon oxide trench fill layers 20b' and 20c' may be further etched to form the pair of twice etched patterned silicon oxide trench fill layers 20b" and 20c" while again employing an aqueous hydrofluoric acid containing etchant solution.

Figure 5A:
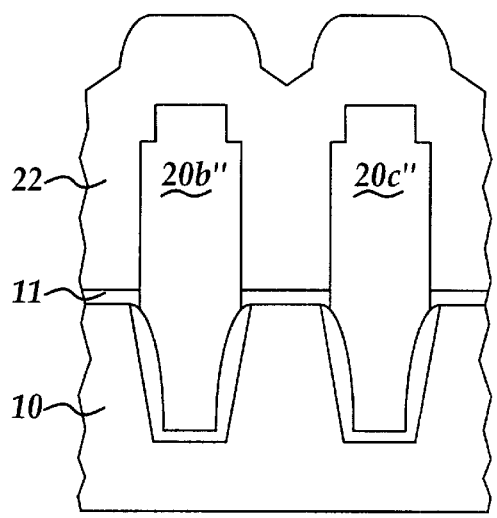
Figure 5B:
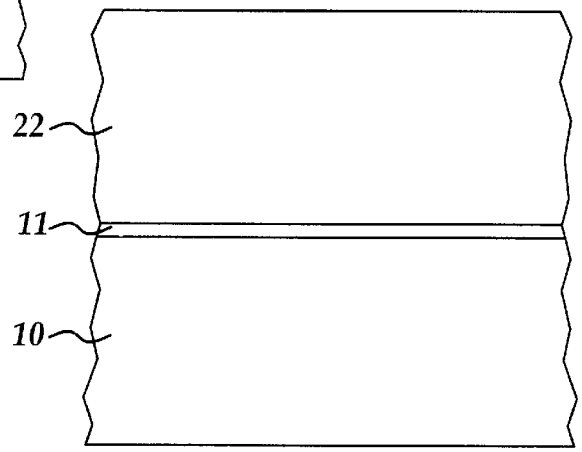

Referring now to FIG. 5A and FIG. 5B, there is shown a pair of schematic cross-sectional diagrams illustrating the results of further processing of the semiconductor integrated circuit microelectronic fabrication whose pair of schematic cross-sectional diagrams is illustrated in FIG. 4A and FIG. 4B.

Shown in FIG. 5A and FIG. 5B is a pair of schematic cross-sectional diagrams of a semiconductor integrated circuit microelectronic fabrication otherwise equivalent to the semiconductor integrated circuit microelectronic fabrication whose pair of schematic cross-sectional diagrams is illustrated in FIG. 4A and FIG. 4B, but wherein, in a first instance, the semiconductor substrate 10 has been thermally oxidized to form thereupon a contiguous tunneling dielectric and isolation trench dielectric liner layer 11 which incorporates the pair of patterned isolation trench dielectric liner layers 11b and 11c as illustrated within the schematic cross-sectional diagram of FIG. 4A.

Within the preferred embodiment of the present invention, the semiconductor substrate 10 is typically and preferably thermally oxidized at a temperature of from about 350 to about 900 degrees centigrade to form the contiguous tunneling dielectric and isolation trench dielectric liner layer 11 having a tunneling dielectric layer portion (i.e., formed upon an active region of the semiconductor substrate 10) of thickness from about 100 to about 300 angstroms.

Shown also within the schematic cross-sectional diagrams of FIG. 5A and FIG. 5B, and formed upon exposed portions of: (1) the contiguous tunneling dielectric and isolation trench dielectric liner layer 11; and (2) the pair of twice etched patterned silicon oxide trench fill layers 20b" and 20c", is a blanket polysilicon layer 22.

Within the preferred embodiment of the present invention, the blanket polysilicon layer 22 is typically and preferably formed to a thickness of from about 1000 to about 2500 angstroms, and formed of a polysilicon material having a dopant incorporated therein.

Figure 6A:
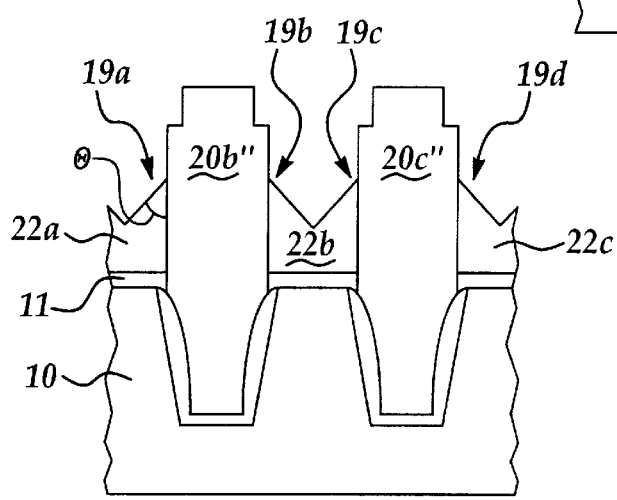
Figure 6B:
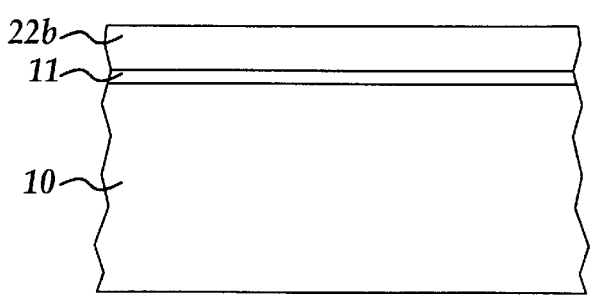

Referring now to FIG. 6A and FIG. 6B, there is shown a pair of schematic cross-sectional diagrams illustrating the results of further processing of the semiconductor integrated circuit microelectronic fabrication whose pair of schematic cross-sectional diagrams is illustrated in FIG. 5A and FIG. 5B.

Shown in FIG. 6A and FIG. 6B is a pair of schematic cross-sectional diagrams of a semiconductor integrated circuit microelectronic fabrication otherwise equivalent to the semiconductor integrated circuit microelectronic fabrication whose pair of schematic cross-sectional diagrams is illustrated in FIG. 5A and FIG. 5B, but wherein the blanket polysilicon layer 22 has been etched to form a series of patterned polysilicon layers 22a, 22b and 22c having interposed therebetween the pair of twice etched patterned silicon oxide trench fill layers 20b" and 20c".

Within the preferred embodiment of the present invention, the blanket polysilicon layer 22 may be etched to form the series of patterned polysilicon layers 22a, 22b and 22c, each of thickness from about 500 to about 1000 angstroms, while employing an anisotropic etch method, such as an anisotropic plasma etch method. By employing such an anisotropic etch method, the series of patterned polysilicon layers 22a, 22b and 22c is formed with a series of pointed edge tips 19a, 19b, 19c and 19d within a series of outer sidewalls thereof which adjoin the pair of twice etched patterned silicon oxide trench fill layers 20b" and 20c". Within the preferred embodiment of the present invention, each of the series of pointed edge tips 19a, 19b, 19c and 19d is formed with an angle θ of from about 10 to about 70 degrees, as illustrated within the schematic cross-sectional diagram of FIG. 6A. Similarly, as is also illustrated within the schematic cross-sectional diagram of FIG. 6A, each of the series of patterned polysilicon layers 22a, 22b and 22c is formed pointed linear recess centered within its linewidth.

Figure 7A:
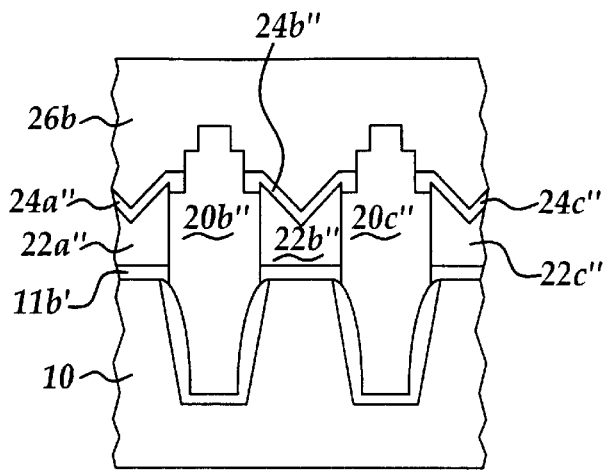
Figure 7B:
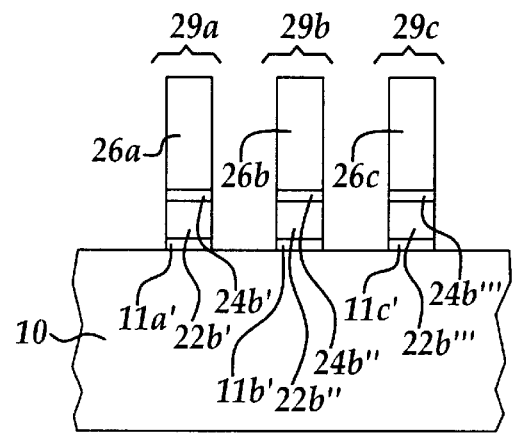

Referring now to FIG. 7A and FIG. 7B, there is shown a pair of schematic cross-sectional diagrams illustrating the results of further processing of the semiconductor integrated circuit microelectronic fabrication whose pair of schematic cross-sectional diagrams is illustrated within FIG. 6A and FIG. 6B.

Shown in FIG. 7A and FIG. 7B is a pair of schematic cross-sectional diagrams of a semiconductor integrated circuit microelectronic fabrication otherwise equivalent to the semiconductor integrated circuit microelectronic fabrication whose pair of schematic cross-sectional diagram is illustrated in FIG. 6A and FIG. 6B, but wherein, in a first instance, the pair of twice etched patterned silicon oxide trench fill layers 20a" and 20b" has been further etched to form a pair of three times etched patterned silicon oxide trench fill layers 20b'" and 20b'".

Such further etching may be again be effected employing an aqueous hydrofluoric acid containing etchant solution, and such further etching is provided such as to fully expose the pointed edge tips 19a, 19b, 19c and 19d of the series of patterned polysilicon layers 22a, 22b and 22c.

Shown also within the schematic cross-sectional diagrams of FIG. 7A and FIG. 7B (more particularly) is a series of patterned control gate electrodes 26a, 26b and 26c formed upon a series of patterned inter-gate electrode dielectric layers 24b', 24b" and 24b'" formed upon a series of floating gate electrodes 22b', 22b" and 22b'" in turn formed upon a series of patterned contiguous tunneling dielectric and isolation trench dielectric liner layers 11a', 11b' and 11c', to form in an aggregate a series of gate electrode stacks 29a, 29b and 29c. Other patterned inter-gate electrode dielectric layers 24a" and 24c", and floating gate electrodes 22a" and 22c", are illustrated more specifically within the schematic cross-sectional diagram of FIG. 7A. Similarly, the schematic cross-sectional diagram of FIG. 7A also illustrates within the patterned control gate electrode 26b a series of pointed edge tips which correspond with the series of pointed linear recesses within the series of floating gate electrodes 22a", 22b" and 22c".

Within the preferred embodiment of the present invention, the series of patterned contiguous tunneling dielectric and isolation trench dielectric liner layers 11a', 11b' and 11c' are formed incident to patterning of the contiguous tunneling dielectric and isolation trench dielectric liner layer 11. Similarly, the series of floating gate electrode 22a", 22b', 22b", 22b'" and 22c" is formed incident to patterning of the series of the patterned polysilicon layers 22a, 22b and 22c. Yet similarly, the series of patterned inter-gate electrode dielectric layers 24a", 24b', 24b", 24b'" and 24c"is formed incident to patterning a series of inter-gate electrode dielectric layers first formed upon the series of patterned polysilicon layers 22a, 22b and 22c. Typically and preferably, the series of inter-gate electrode dielectric layers is formed incident to thermal oxidation of the series of patterned polysilicon layers 22a, 22b and 22c at a temperature of from about 750 to about 950 degrees centigrade to form the series of patterned intergate dielectric layers of thickness from about 100 to about 250 angstroms. Finally, the series of patterned control gate electrodes 26a, 26b and 26c is formed to a linewidth of from about 0.1 to about 0.2 microns and a thickness of from about 1000 to about 2500 angstroms, typically and preferably from a doped polysilicon material having a dopant concentration of from about $10^{20}$ to about $10^{21}$ dopant atoms per cubic centimeter.

Figure 8A:
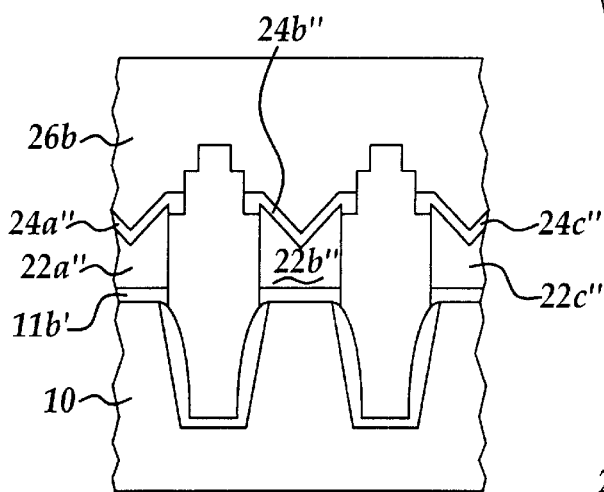
Figure 8B:
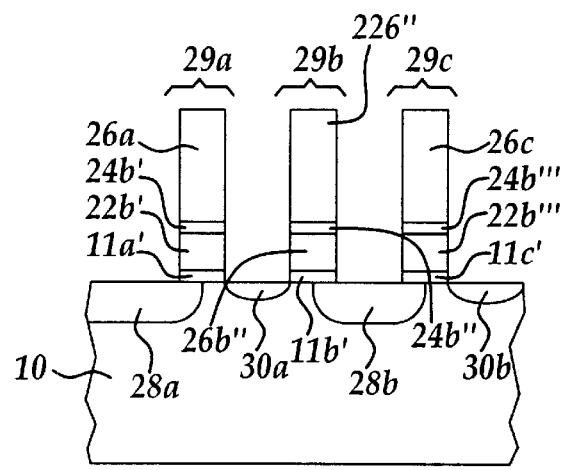

Referring now to FIG. 8A and FIG. 8B, there is shown a pair of schematic cross-sectional diagrams illustrating the results of further processing of the semiconductor integrated circuit microelectronic fabrication whose schematic cross-sectional diagram is illustrated in FIG. 7A and FIG. 7B.

Shown in FIG. 8A and FIG. 8B is a pair of schematic cross-sectional diagrams illustrating a semiconductor integrated circuit microelectronic fabrication otherwise equivalent to the semiconductor integrated circuit microelectronic fabrication whose pair of schematic cross-sectional diagram is illustrated in FIG. 7A and FIG. 7B, but wherein there is formed within the semiconductor substrate 10, and separated by the series of gate electrode stacks 29a, 29b and 29c a pair of first source/drain regions 28a and 28b separated from a pair of second source/drain regions 30a and 30b.

As is illustrated within the schematic cross-sectional diagram of FIG. 8B, the pair of first source/drain regions 28a and 28b is formed penetrating beneath the series of floating gate electrodes 22b', 22b" and 22b'", while the pair of second source/drain electrodes 30a and 30b is formed nominally aligned, and penetrating less further beneath, the series of floating gate electrodes 22b', 22b" and 22b'". Neither of the pair of first source/drain regions 28a and 28b, nor either of the pair of second source/drain regions 30a and 30b is laterally separated from a floating gate electrode 22b', 22b" or 22b'" edge or sidewall.

Within the preferred embodiment of the present invention, the pair of first source/drain regions 28a and 28b and the pair of second source/drain regions 30a and 30b are formed employing separate selectively masked ion implantation methods in turn employing implanted dopant ions (i.e., phosphorus and arsenic with respect to an N channel stacked gate field effect transistor (FET) device) of differing thermal diffusivities to provide the pair of first source/drain regions penetrating further beneath the series of floating gate electrodes 22b', 22b" and 22b'" than the pair of second source/drain regions 30a and 30b, where neither the pair of first source/drain regions 28a and 28b, nor the pair of second source/drain regions 30a and 30b is spaced from a edge of the series of floating gate electrodes 22b', 22b" and 22b'".

Upon forming the series of stacked gate field effect transistor (FET) devices whose schematic cross-sectional diagram is illustrated within FIG. 8A and FIG. 8B, there is formed a series of stacked gate field effect transistor (FET) devices in accord with the preferred embodiment of the present invention. The series of stacked gate field effect transistor (FET) devices exhibit enhanced performance with respect to programming characteristics and erasing characteristics incident to being formed employing the pointed edge tips 19a, 19b, 19c and 19d at the sidewalls of the series of floating gate electrodes 22a", 22b" and 22c", and the pointed linear recesses within the linewidths of the series of floating gate electrodes 22a", 22b" and 22c". Similarly, the series of stacked gate field effect transistor (FET) devices exhibit enhanced coupling incident to having the pair of source/drain regions 28a and 28b, which preferably serve as a pair of drain regions within an N channel device, formed further penetrating beneath the series of floating gate electrodes 22b', 22b" and 22b'" than the pair of second source/drain regions 30a and 30b.

With respect to operation of a stacked gate field effect transistor (FET) device in accord with the present invention, it is contemplated for an N channel stacked gate field effect transistor (FET) device fabricated in accord with the foregoing description that programming may be effected through control gate to floating gate charge injection with a control gate voltage of −10 volts, a drain voltage of 6 volts and the source grounded. It is also contemplated that block erasure may be effected through floating gate to control gate charge injection with a control gate voltage of 13 volts, and both the source and drain grounded. Similarly, within a block erasure, individual devices may be de-selected for erasure (and retain charge) by applying to their individual drain regions a 6 volt bias voltage. Thus, the present invention also provides single bit erasing within an array of stacked gate field effect transistor (FET) devices.

As is understood by a person skilled in the art, the preferred embodiment of the present invention is illustrative of the present invention rather than limiting of the present invention. Revisions and modifications may be made to methods, materials, structures and dimensions employed for forming a stacked gate field effect transistor (FET) device in accord with the preferred embodiment of the present invention while still providing a stacked gate field effect transistor (FET) device in accord with the present invention, further in accord with the accompanying claims.

What is claimed is:

1. A stacked gate field effect transistor device comprising:
   a semiconductor substrate having an active region defined therein;
   a tunneling dielectric layer formed upon the active region of the semiconductor substrate;
   a floating gate electrode formed upon the tunneling dielectric layer;
   an inter-gate electrode dielectric layer formed upon the floating gate electrode;
   a control gate electrode formed upon the inter-gate electrode dielectric layer; and
   a pair of source/drain regions formed adjacent a pair of opposite edges of the floating gate electrode, wherein
      the floating gate electrode is formed with a pointed edge tip at its outer sidewall;
      the floating gate electrode is formed with a pointed linear recess centered within its linewidth; and
      the pair of source/drain regions is formed asymmetrically penetrating beneath the pair of opposite edges of the floating gate electrode and not laterally spaced from a floating gate electrode sidewall.

2. The stacked gate field effect transistor device of claim 1 wherein the tunneling dielectric layer is formed to a thickness of from about 80 to about 100 angstroms.

3. The stacked gate field effect transistor device of claim 1 wherein the floating gate electrode is formed to a thickness of from about 500 to about 1000 angstroms.

4. The stacked gate field effect transistor device of claim 1 wherein the control gate electrode is formed to a thickness of from about 1000 to about 2500 angstroms.

5. The stacked gate field effect transistor device of claim 1 wherein the stacked gate field effect transistor device is an N channel stacked gate field effect transistor device.

\* \* \* \* \*